United States Patent
Melanson et al.

(10) Patent No.: US 6,765,436 B1
(45) Date of Patent: Jul. 20, 2004

(54) POWER SUPPLY BASED AUDIO COMPRESSION FOR DIGITAL AUDIO AMPLIFIER

(75) Inventors: John L. Melanson, Austin, TX (US); Xiaofan Fei, Austin, TX (US); Johann G. Gaboriau, Austin, TX (US); Steven Green, Austin, TX (US); Jason P. Rhode, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 126 days.

(21) Appl. No.: 10/234,893

(22) Filed: Sep. 4, 2002

(51) Int. Cl.[7] .............................. H03F 3/38; H03F 3/217

(52) U.S. Cl. ....................... 330/10; 330/132; 330/207 A

(58) Field of Search ....................... 330/10, 132, 207 A, 330/251

(56) References Cited

U.S. PATENT DOCUMENTS

| | | | |
|---|---|---|---|
| 4,737,731 A | * | 4/1988 | Swanson et al. ............... 330/10 |
| 5,548,286 A | | 8/1996 | Craven |
| 5,559,467 A | | 9/1996 | Smedley |
| 5,784,017 A | | 7/1998 | Craven |
| 5,815,102 A | | 9/1998 | Melanson |
| 6,188,276 B1 | * | 2/2001 | Simpoulos ................... 330/10 |
| 6,369,729 B1 | | 4/2002 | Srinivasan et al. |

FOREIGN PATENT DOCUMENTS

WO WO97/34733 10/1997

* cited by examiner

Primary Examiner—Michael B Shingleton
(74) Attorney, Agent, or Firm—Steven Lin, Esq.

(57) ABSTRACT

A gain control at the input monitors an input signal and a supply voltage, which drives an output. The gain control adjusts the gain to compress the input signal when the supply voltage decreases in magnitude and/or the input signal is of such magnitude to cause the supply voltage to decrease.

27 Claims, 6 Drawing Sheets

US 6,765,436 B1

POWER SUPPLY BASED AUDIO COMPRESSION FOR DIGITAL AUDIO AMPLIFIER

FIELD OF THE INVENTION

The present invention relates to a power supply based compression technique in a digital audio amplifier.

BACKGROUND OF THE RELATED ART

The use of switched mode output stage(s) in audio amplification, in which the conversion is performed digitally, allows audio output from digital signal input. The digital signal conversion may be achieved by a variety of devices. One particular technique utilizes a delta-sigma ($\Delta\Sigma$) modulator, in which the digital input signal is filtered and then quantized to produce an output. In one switched technique, the noise-shaped quantized signal from the quantizer is coupled to a pulsewidth modulator (PWM), in which a value of the quantized signal controls the duty cycle of the PWM output. This PWM output then controls the operation of a switching device or devices, utilized as the output stage of an amplifier to drive a load. The filtered digital signal is used to modulate the pulsewidth of the PWM signal to control the duration of the switch on/off time of the output stage to the load. Thus, delta-sigma modulator circuitry coupled with a PWM circuitry may be utilized to operate as a switching amplifier to drive a load. Accordingly digital signals are converted to an audio drive signal to drive a load, such as an audio speaker.

In a variety of systems employing a switching amplifier, the power supply that sources the voltage to drive the load, may not source a constant supply voltage over the full range of operation of the switching amplifier. For example, in some instances, the power supply may be under-rated for the required operational specification (under-specified). For example, a particular power supply may be specified to provide a given maximum or nominal power to one output channel. However, the same power supply may not be capable of providing the same specified power to multiple channels at the same time or to a single channel over a longer period of time. In other instances, the load may change causing the power supply to operate at less than the fully-rated voltage.

Typically, voltage variations in a power supply, whether due to external factors or changes in circuit operation, are more noticeable with consumer electronic devices as compared to professional units. Since many power supplies in audio equipment are generally under-rated for maximum desired capability, a variety of power supply compensation techniques are employed to regulate the power supply. In a switching amplifier, such as in the $\Delta\Sigma$/PWM amplifier mentioned above, mechanisms are employed to ensure a fairly constant supply voltage from the power supply. In one technique, the power supply voltage is monitored within the $\Delta\Sigma$ stage to adjust the pulse width of the PWM signal corresponding to changes in the power supply voltage. Therefore, when the power supply voltage changes its value, a corresponding compensating adjustment is made to the pulsewidth of the PWM signal coupled to the output switching device or devices.

Although this compensating technique adjusts for non-constant power supply voltages under slow changing conditions, the technique may fail to compensate if the power supply is under-rated or if certain operating parameter of the power supply is exceeded. For example, the power supply may provide x volts as its nominal output when no load of the amplifier exists. At full load of the amplifier, the supply in this particular example decreases to x-y volts. Therefore, digital full-scale input may be set to the full "rail" voltage of the power supply at x volts or may be set to a lower voltage of x-z volts. If the digital full-scale input is set to the nominal value of the power supply, certain high driving inputs will cause the output to be clipped when the supply voltage decreases. The clipping of the output results in distortion. Alternately, if the full-scale input is set to the lower voltage (x-z), then the output signal will not be driven close to the full capability of the power supply under normal conditions. Although distortion may be reduced, the output is not driven to its full nominal capability and generally the sound is much quieter.

A need exists to have a switching amplifier, which may be driven at or near its nominal supply potential but also limit the amount of the distortion when the supply is driven beyond its capability.

SUMMARY OF THE INVENTION

A switching amplifier to receive a digital input signal and output an audio signal in response to the input signal. A gain control unit monitors the digital input signal and a supply voltage used to drive the switched output and adjusts the gain of the input signal in response to changes in the two monitored values to reduce distortion of the audio output signal.

DETAILED DESCRIPTION OF THE EMBODIMENTS

Figure 1:
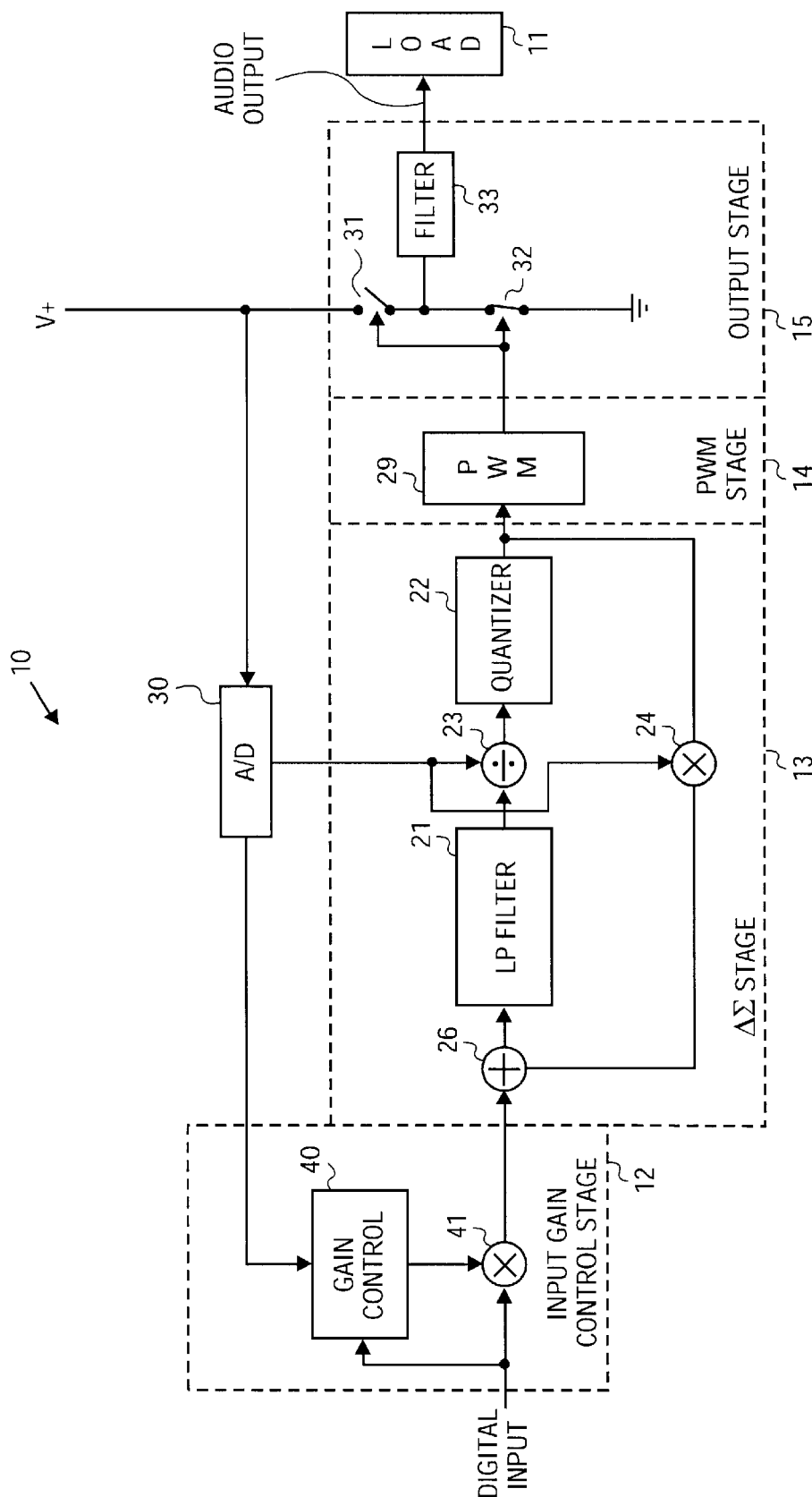
FIG. 1 is a block schematic diagram of an embodiment of a switching amplifier implementing a power supply based compression technique at the input.

FIG. 1 illustrates an audio switching amplifier (also referred to as a switch mode amplifier) that implements a power supply based compression. The exemplary circuit of FIG. 1 is one embodiment for practicing the present invention. The embodiment of the invention shown in FIG. 1 is a switching amplifier circuit 10 having four stages to convert a digital input signal into an audio output. The audio output signal from switching amplifier circuit 10 is coupled to a load 11. Although only four stages are shown to describe the operation of the switching amplifier 10, other stages and/or circuitry may be present in other embodiments implementing the present invention.

In the exemplary embodiment of FIG. 1, an input gain control stage 12, delta-sigma ($\Delta\Sigma$) stage 13, pulsewidth modulation (PWM) stage 14, and output stage 15 are the four stages of switching amplifier 10. Load 11 receives the audio output from output stage 15. The input to input gain control stage 12 is a digital signal input, which is generally an audio digital signal input for audio applications. The ΔΣ stage 13, which follows the input gain control stage 12, filters the input signal and quantizes the filtered signal utilizing a delta-sigma modulation technique. The noise-shaped quantized signal from the ΔΣ stage 13 controls the pulsewidth modulation of PWM stage 14 to generate an output from output stage 15. The PWM signal to output stage 15 controls the operation of the switches of switching amplifier circuit 10, which couples power supply voltage V+ to drive load 11.

Input gain control stage 12 receives the digital input signal, adjusts the gain of the digital signal and couples the gain adjusted digital signal to ΔΣ stage 13. A more detail description of input gain control stage 12 is described later in this disclosure. ΔΣ stage 13 receives the gain adjusted digital signal, filters the digital signal, and quantizes the filtered signal so that a noise-shaped signal is output from ΔΣ stage 13. The noise-shaped signal is then used to drive PWM stage 14, which then drives output stage 15. As noted, the particular embodiment shown as switching amplifier circuit 10 utilizes a low-pass ("LP") filter 21 to filter the digital signal and the filtered signal is coupled to a quantizer 22 after passing through a divider 23. Divider 23 is shown disposed between LP filter 21 and quantizer 22.

Divider 23 divides the output of the LP filter 21 by a voltage value, which may be the supply voltage value itself or a proportionate amount, and the quantizer 22 quantizes the filtered signal. The output of quantizer 22 is coupled through a multiplier 24 and fed back in a feedback loop to the input of LP filter 21. A summation node 26 is utilized to sum the coupled feedback signal with the input signal at the input of LP filter 21. Generally, divider 23 compensates for the voltage on the output switches and multiplier 24 compensates for divider 23 in the feedback path. Typically, an analog to digital (A/D) converter 30 is utilized to convert the power supply voltage V+ to a digital value to control divider 23 and multiplier 24. By monitoring the power supply voltage V+, divider 23 and multiplier 24 are adjusted correspondingly to compensate for the changes in the power supply. A variety of ΔΣ modulators and PWM circuitry may be implemented to provide the filtering, noise-shaping and modulation to drive output stage 15 to develop the corresponding output signal to load 11.

As noted above, the output of quantizer 22 is a noise-shaped signal corresponding to the input digital signal. The quantizer output is coupled to a PWM circuit 29. A variety of pulse-shaping circuitry may be used for PWM circuit 29. The pulsewidth of the signal output from PWM circuit 29 corresponds to the value of the digital audio signal input to switching amplifier circuit 10, with some amount of power supply compensation provided by the combination of the divider/multiplier network. The output of PWM circuit 29 is then coupled to output stage 15 and, in the particular embodiments that are shown, output stage 15 includes the switching device(s) of the switching amplifier circuit 10. In the exemplary embodiment shown, the switching amplifier circuit 10 has switches 31 and 32, which are used to switch the power supply to load 11 through a filter 33. In the shown embodiment, switches 31 and 32 are serially arranged between power supply voltage (V+) and its return, which is shown as ground in this instance. Switches 31 and 32 may be of a variety of components, including power field-effect-transistors (FETs).

During operation of switching amplifier circuit 10, one switch 31 or 32 is open (closed) while the other switch is closed (open). The determination of which switch is open or closed is determined by the state of the signal from PWM circuit 29. Thus, by alternatively opening and closing each of the pair of switches 31 and 32, the voltage output to load 11 is controlled by the duration of the duty cycle of the signal from PWM circuit 29. The actual number of switches 31 and 32 may vary depending on the particular circuit employed. In some instances, only one pair of switches may exist. In other instances, more switches may exist. For example, a bridge circuit may have four switches in which pairs of switches open and close between a voltage and ground or between a positive and negative voltages.

In the particular exemplary switching amplifier circuit 10 of FIG. 1, power supply voltage return is shown as ground. However, in other embodiments, the return may be a voltage, such as V−, so that the load operates between a positive and negative supply rail voltages. Filter 33 operates to filter out high frequency components so that only the lower frequency components (audio signals) are coupled to load 11. Load 11 may include a variety of audio driven devices, and in one embodiment, the load is a speaker or set of speakers.

As noted in the background section above, switching amplifiers may have fluctuating outputs when adequate power supply regulation is not present. Many commercially available audio systems tend to have a power supply unit that operates adequately under general operating conditions but may fail to supply the voltage when subjected to conditions exceeding nominal usage. As explained in the background section above, the input digital signal may be scaled to a predetermined nominal value, such as the full value of the power supply rail voltage (or some nominal value below the full voltage value). Thus, if the full scale digital input is set to the rail voltage of the power supply (or very close to it), a likelihood that the input signal may be clipped exists if the power supply is driven hard so that the supply voltage drops below the specified nominal value. Alternatively, in order to prevent or limit the clipping (causing distortion), the full scale input may be set to a value below the rail voltage of the power supply. However, as noted previously, this scheme has the disadvantage in that volume of the signal (e.g., loudness) may be sacrificed for normal operation of the amplifier. In order to ensure that full scale digital input may be maintained while preventing or minimizing the distortion (such as clipping), switching amplifier circuit 10 employs input gain control stage 12.

A/D converter 30 receives power supply voltage V+ and converts the analog voltage value to a digital value. The converted supply voltage value from the output of A/D converter 30 is coupled to divider 23 and multiplier 24 to compensate for slower changes in power supply voltage V+. The output of A/D converter 30 is also fed into a gain control circuit 40 of input gain control stage 12. Gain control unit 40 monitors both power supply voltage V+ from A/D converter 30 and the input digital signal. Gain control unit 40 then adjusts the gain of the input signal being coupled to the input of ΔΣ stage 13. The gain adjustment is performed by multiplier unit 41 in input gain control stage 12 of FIG. 1. Gain control unit 40 monitors power supply voltage V+ and the input signal and adjusts the gain of the input signal based on the values of the two signals.

As noted, typical audio signals have average signal levels well below the rated levels for the amplifier and assumes that the signal peaks are often short in duration. The short duration, high peaks typically do not decrease power supply voltage V+ as much as longer signal peaks. However, when sufficiently high amplitude signals are present at the input or high peak signals of sufficient duration causing decrease of power supply voltage V+, gain control unit 40 senses the combination of the input signal and the supply voltage to determine adverse response due to higher input peak and/or the decreasing of power supply voltage V+. When gain control unit 40 senses a condition that may cause the output to be distorted, gain control unit 40 adjusts the gain of the input signal to $\Delta\Sigma$ stage 13. Generally, the gain is reduced so that the peak of the signal is at a value not exceeding the threshold point at which clipping occurs. Thus, by controlling the gain of the digital signal at the input of $\Delta\Sigma$ stage 13, conditions that would normally cause distortion are now controlled by controlling the amount of compression of the input signal. In this manner, the full scale input may be set at or near the rail voltage of the power supply (nominal setting) but compressed when a condition that may likely cause distortion (such as clipping) of the output is noted and/or predicted.

Furthermore, since the full scale setting is set at or near the nominal value of the power supply, the volume of the signal (e.g., loudness) may be retained and only sacrificed when the input signal would cause a distortion at the output. Accordingly, the use of a gain control stage 12 to control the gain of the input signal prevents (or at least minimizes) the distortion while preserving the sense of higher volume of the output signal. Gain control stage 12 may include various circuitry and/or be software driven to provide the corresponding adjustment. Furthermore, circuitry or software may also provide a response based on prediction of a condition which would lead to distortion by monitoring the supply voltage and the input signal.

Figure 2:
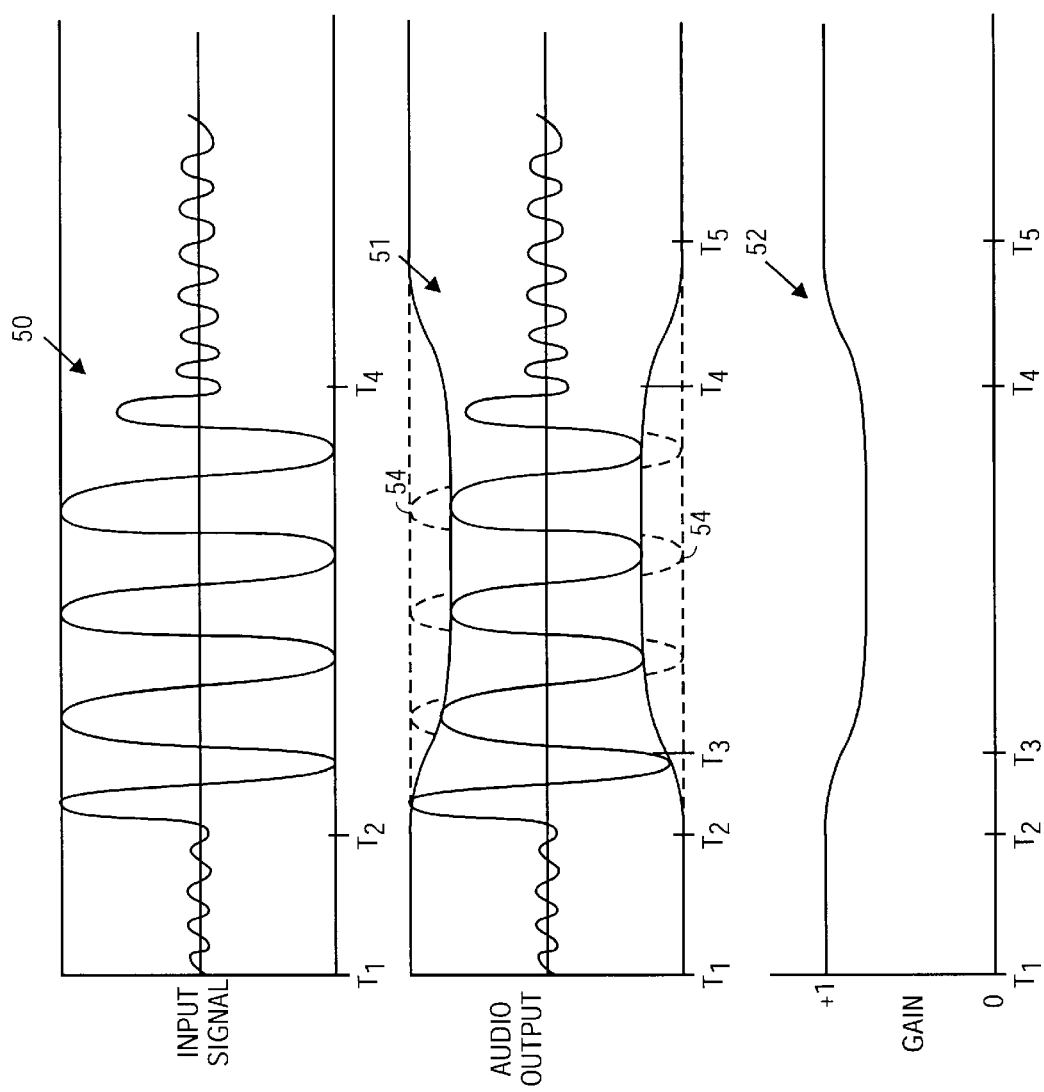
FIG. 2 is a waveform diagram showing input and output signals from the switching amplifier of FIG. 1 when the input gain control technique is employed to control the gain of the input signal.

FIG. 2 illustrates waveform diagrams showing one exemplary operation of the volume management provided by switching amplifier circuit 10 of FIG. 1. FIG. 2 shows input signal 50 that is substantially quiet (low amplitude) at time $T_1$ but increases to nearly full scale at time $T_2$ and decreases to about a quarter of the full scale level (–12 dB) at time $T_4$. An output signal 51 is shown in response to the input signal 50. A gain setting diagram 52 is also shown below the two signals 50, 51 to correspond to the gain adjusted input signal at the input of $\Delta\Sigma$ stage 13.

As noted in the diagrams, the power supply decreases about ten percent (10%) below the nominal level commencing around time $T_2$ due to a higher amplitude signal at the input. Around time $T_3$, the power supply no longer supports the full scale signal at unity gain and power supply voltage V+ begins to decrease to a lesser value. If this condition were to persist, the output signal would most likely be clipped since the input signal full scale corresponds to the nominal voltage of the power supply. The portion of the signal being clipped is shown by the dotted line 54. The audio signal at the output would be distorted if the clipping condition existed.

However, as noted by the waveform diagrams of signals 51 and 52, the input gain is adjusted accordingly down at a point between time $T_2$ and $T_3$ so that multiplier unit 41 reduces the gain of the input signal. This reduction in the input signal gain causes the input signal to be compressed at the input of $\Delta\Sigma$ stage 13. The compressed input allows the output signal to be correspondingly adjusted so that the peak of the output occurs near the lower value of the decreasing power supply voltage V+. As shown by the waveform diagram of output signal 51, the peak of the signal is lower, but the clipping is either not present or significantly reduced. At time $T_4$, the input gain begins to return to its full scale level in response to a lower driven input signal, and a corresponding increase in the signal response occurs at the output. Finally, at time $T_5$, switching amplifier circuit 10 has recovered fully to its normal operating point, in that the input signal is not compressed and the input gain is returned to the nominal operating value.

Gain control circuit 40 controls the level of the gain applied to the input signal. In one embodiment, the full scale or nominal operation gain is set at unity, and the compressed values set at below unity gain. However, other values may be selected for the various gain settings. The time constants for gain increase/decrease may be selected based on the characteristics of the power supply. For example, in one embodiment, gain value may be turned down at approximately 1 dB every one millisecond (the "attack time") and turned up to recover at approximately 1 dB every 100 milliseconds (the "decay time"). If the attack time is too slow, the distortion or peaks may increase. However if the attack time is too fast, transient audio events may lose impact. Similarly, if the decay time is too fast, the listener will hear pumping of the sound, and if too slow, the gain may always be at the lower level and the amplifier system may always sound softer or quieter to the listener. Again, various circuitry and/or software may be used to predict and respond to the state of the input signal when compared to the supply voltage.

Figure 3:
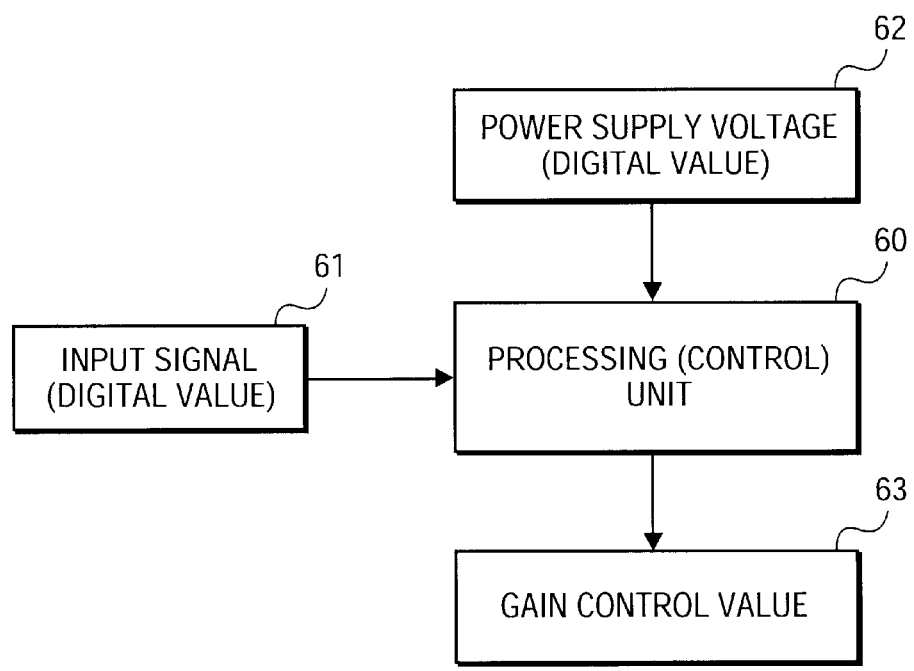
FIG. 3 is a block diagram showing the monitoring of the power supply voltage value and the input signal to generate a gain control value.
Figure 4:
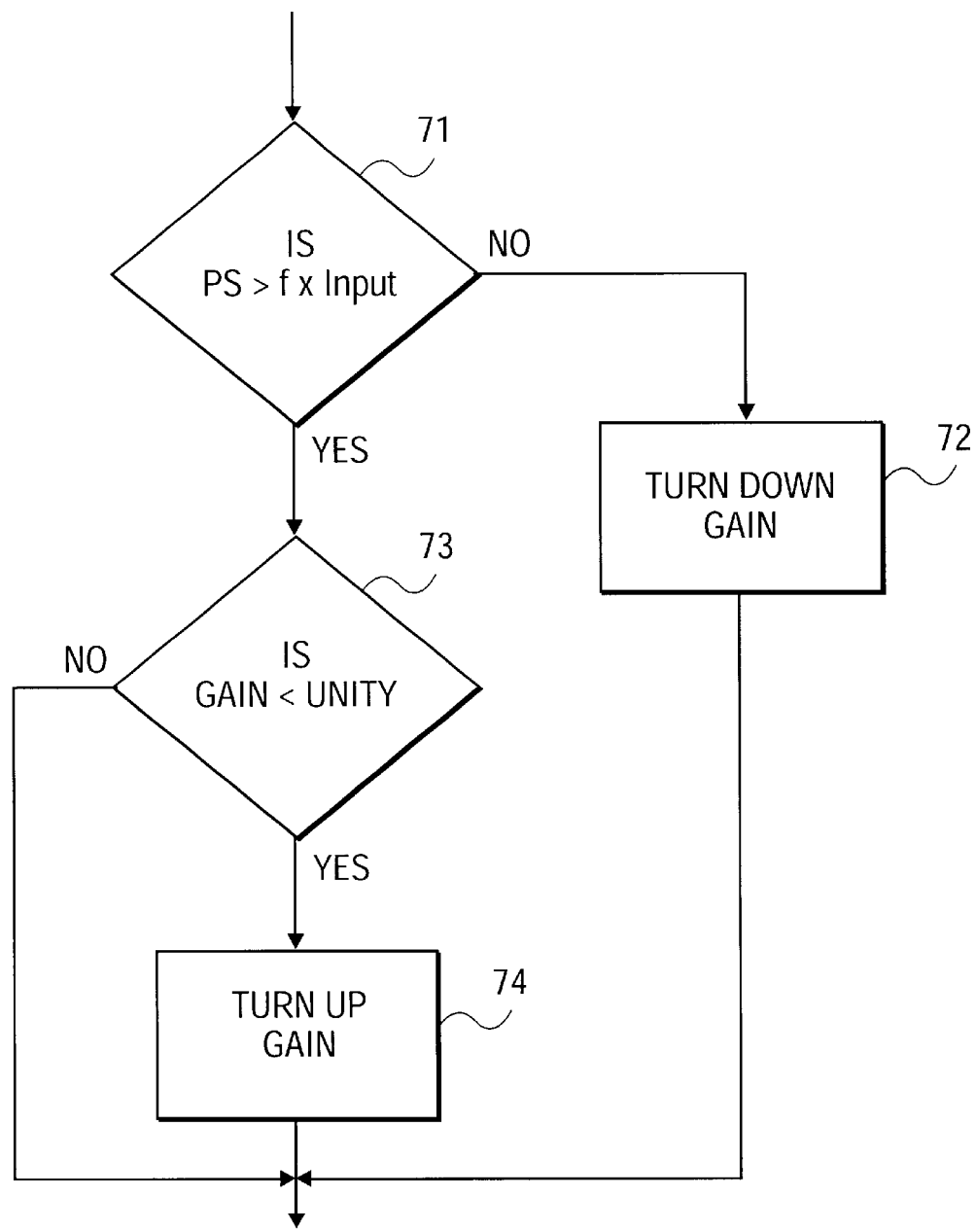
FIG. 4 is a flow diagram of one exemplary application to control the gain of the input signal.

One embodiment for performing the gain control by the input gain control unit 40 is shown in FIGS. 3 and 4. A processing unit 60 receives the digital input signal 61 (which may be a digital value) and a digital value of power supply voltage 62 and compares the two values to generate a gain control value 63. The processing may be performed in a variety of ways to sense the supply voltage and the input signal and respond accordingly to adjust the input gain. FIG. 4 illustrates one software implementation to generate gain control value 63 to adjust the gain of the input signal. The input signal value and the power supply value are compared to determine if the power supply value is greater in magnitude than the input signal value times a given factor f (as shown in block 71 of diagram 70). The factor f may be unity, less than 1.0, or greater than 1.0. In one embodiment, the factor f is set to a value of 1.1so that gain adjustments may be made before the power supply voltage decreases to the peak of the input signal. If the value is exceeded, then the gain is turned down at a specified value (as shown in block 72), which is the attack time and the example noted above used about 1 dB every millisecond.

If the value is not exceeded, then the gain is checked to determine if it is at unity (block 73). If the gain is at less than unity, then the gain is turned up at a specified value (block 74), which is the decay time and the example above used about 1 dB every 100 milliseconds. The loop is repeated to continually monitor the input signal and the power supply voltage to accordingly adjust the gain of the input signal. One application for monitoring and adjusting the input signal gain is based on the input signal and the power supply. Although the peak levels are described as the nominal levels for adjustment, other voltage levels may be used as the nominal level. Furthermore, the gain control may be implemented in hardware, such as by use of comparators; or a combination of software and hardware implementation may be utilized. In one software application, a program code operating with a processor monitors the supply voltage and the input signal value and predicts a condition for distortion based on the data values received.

Figure 5:
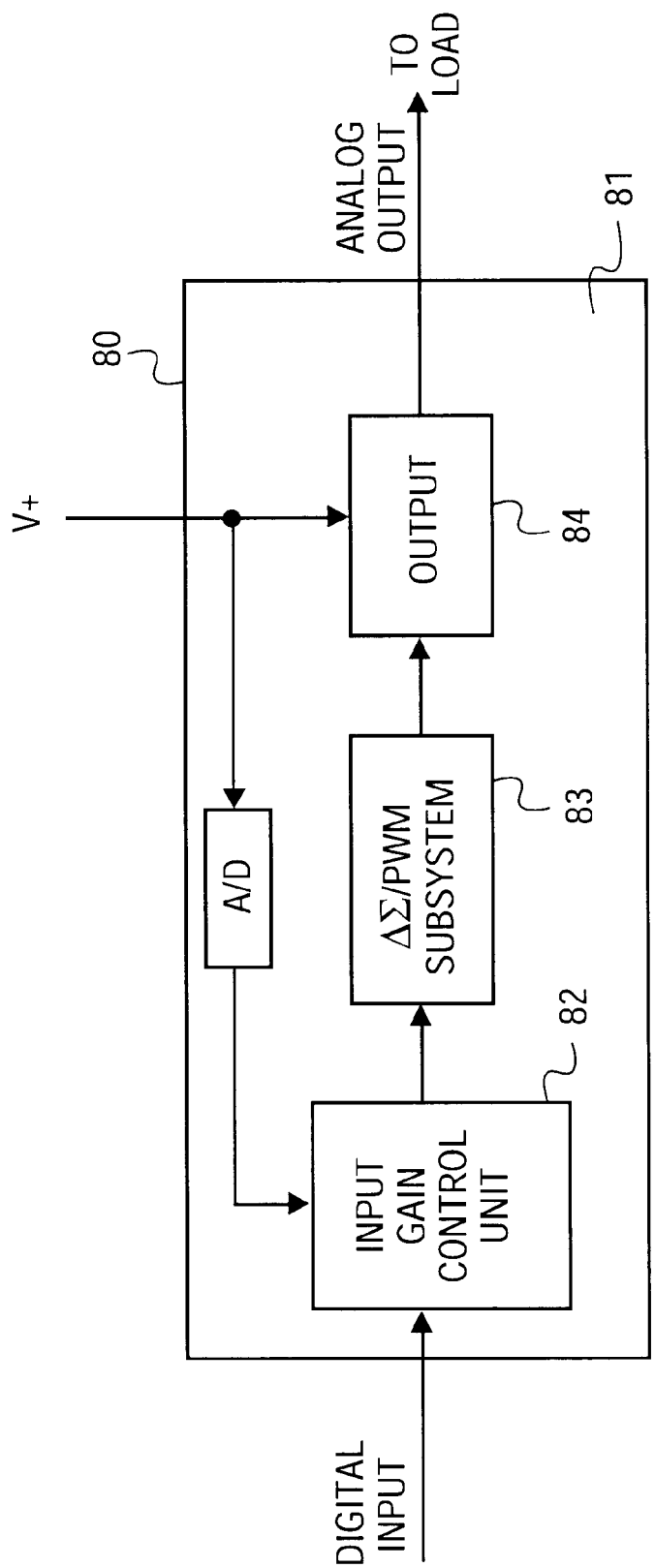
FIG. 5 is a block schematic diagram of an integrated circuit utilizing the switching amplifier of FIG. 1.

FIG. 5 illustrates a more generic embodiment for implementing the gain control technique to compress the input signal based on a power supply voltage. In this exemplary embodiment, circuitry 81 is part of an integrated circuit 80

(such as an integrated circuit fabricated on a silicon wafer), in which a digital input signal is input to integrated circuit 80, and an audio signal is output from integrated circuit 80. The output is generally coupled to a load, such as a speaker(s). A power supply voltage is coupled to integrated circuit 80 from a power supply unit. Again, more than one supply voltage may be coupled to the integrated circuit 80. Four stages 12 to 15 noted in FIG. 1 are shown implemented within integrated circuit 80 as stages 82 to 84 (e.g., stages 13 and 14 are shown combined as ΔΣ/PWM subsystem 83). Integrated circuit 80 may include processing components, as well as memory, to control and process the components within integrated circuit 80. Thus, software to adjust the input gain and/or processing power to perform the processing may be included as part of integrated circuit 80. Alternatively, processing and/or data storage functions may be relegated to components or devices external to the integrated circuit 80.

Figure 6:
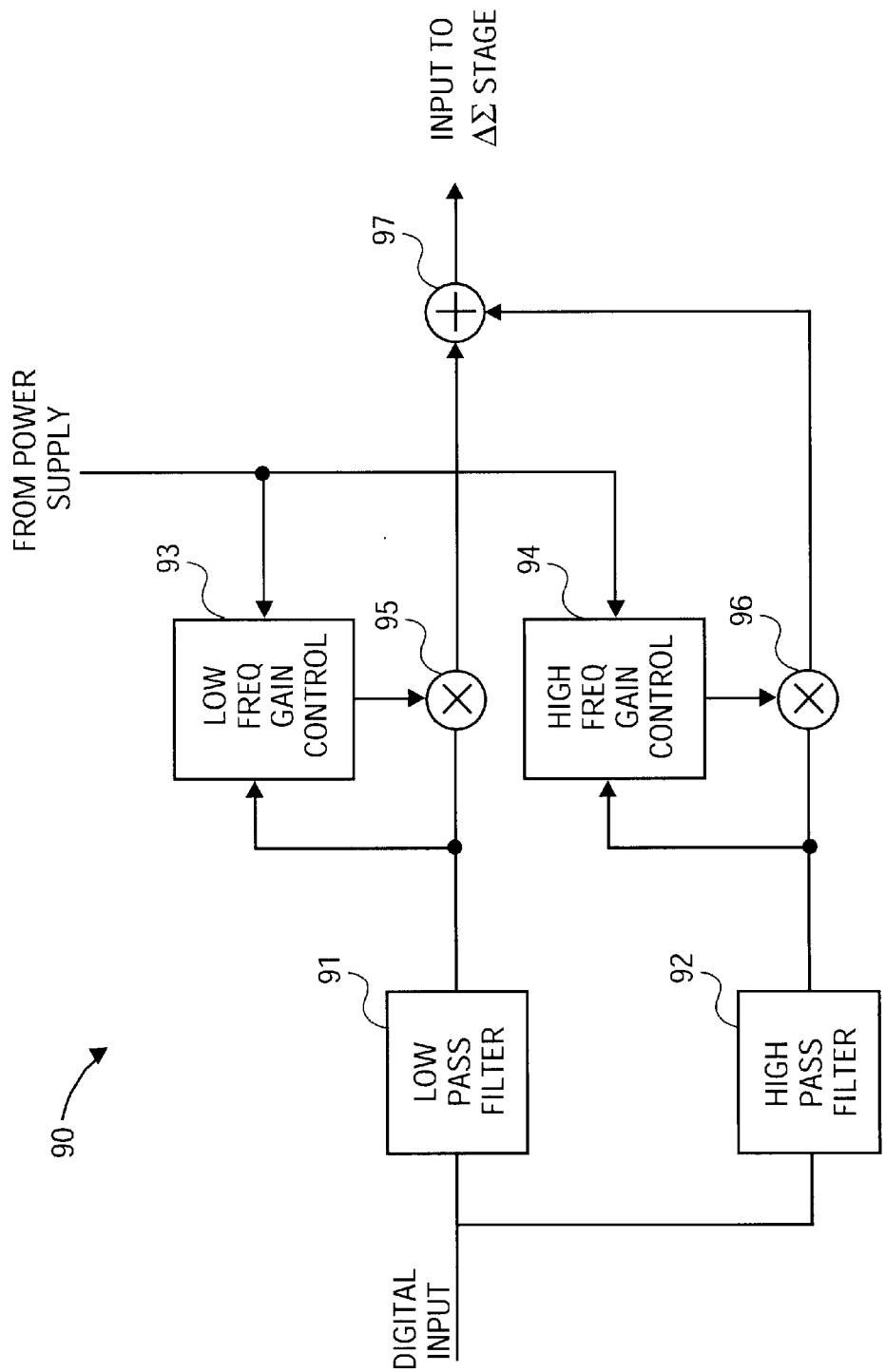
FIG. 6 is an alternative embodiment in which the input signal gain control is obtained across a frequency band.

FIG. 6 illustrates an example of an input gain control stage 90, which separates the signal gain control into frequency bands. In the example shown, the separation is to two frequency bands. A low pass filter 91 and high pass filter 92 are used to filter high and low frequency components of the input signal. A low frequency gain control unit 93 is used in combination with low pass filter 91 to control the gain of the lower frequency component at a multiplier 95. Likewise a high frequency gain control unit 94 is utilized in combination with high path filter 92 to control the gain of the high frequency component at a multiplier 96. A summation node 97 (which may be the same or different node as summation node 26 of FIG. 1) then combines the two gain controlled inputs for input to the ΔΣ stage, such as ΔΣ stage 13 of FIG. 1. The separation of the frequency bandwidth for gain control at the input may be separated into multiple frequency bands instead of just two. The frequency separation for gain adjustment allows for much more flexibility in controlling the various frequency components of the audio signal.

Thus, power supply based audio compression for digital audio amplifier is described. While the embodiments of the invention have been particularly shown and described, it will be understood by those skilled in the art that various changes in form and detail may be made therein without departing from the spirit and scope of the invention.

We claim:

1. An apparatus, comprising:
    a switching amplifier to receive a digital input signal and output an output signal in response to the input signal; and
    a gain control unit coupled to monitor the digital input signal and a supply voltage used to drive said switching amplifier, wherein the gain control unit adjusts a gain of the input signal in response to a change in the supply voltage or the input signal, or both, to reduce distortion of the output signal.

2. The apparatus of claim 1, wherein said switching amplifier includes a delta-sigma filter and quantizer stage to filter and quantize the digital input signal and further includes a pulse-shaping circuit to pulse modulate a corresponding switching signal to drive switching of the supply voltage to generate the output signal.

3. The apparatus of claim 1, wherein said gain control unit maintains the input signal at a level to prevent clipping of the output signal.

4. The apparatus of claim 1, further comprising an analog-to-digital converter to convert the supply voltage to a digital value which is processed to adjust the gain of the input signal.

5. The apparatus of claim 4, wherein the gain is set to a predetermined value when the supply voltage is at a nominal value and the gain is to be reduced when the supply voltage decreases from the nominal value.

6. The apparatus of claim 4, wherein the gain is set to a predetermined value when the supply voltage is at the nominal value and the gain is to be reduced when the supply voltage decreases to a lower voltage value from a full value and a signal level of the input signal approaches the lower voltage value.

7. The apparatus of claim 5, wherein the predetermined value of the gain is set to unity at the nominal value of the supply voltage.

8. The apparatus of claim 1, wherein said gain control unit separates the monitoring of the digital input signal at different frequency bands and adjusts the gain across the different frequency bands.

9. The apparatus of claim 4, wherein said switching amplifier further comprises a filter and a quantizer to form a delta-sigma modulator stage to filter and quantize the digital input signal and wherein a divider and multiplier are utilized to compensate for slow changes in the supply voltage, the digital value of the supply voltage being coupled to the divider and multiplier to control the adjustment of the divider and the multiplier in response to the supply voltage.

10. An apparatus, comprising:
    a switching amplifier to receive a digital input signal and output an audio signal in response to the input signal; and
    a gain control unit coupled to monitor the digital input signal and a supply voltage used to drive said switching amplifier, wherein the gain control unit adjusts a gain of the input signal in response to a change in the supply voltage or input signal, or both, to reduce distortion of the audio signal.

11. The apparatus of claim 10, wherein said switching amplifier includes a delta-sigma filter and quantizer stage to filter and quantize the digital input signal and further includes a pulse-shaping circuit to pulse modulate a corresponding switching signal to control switching of the supply voltage to drive the audio signal.

12. The apparatus of claim 11, further comprising an analog-to-digital converter to convert the supply voltage to a digital value to compare the supply voltage to the digital input signal to adjust the gain of the input signal based on the comparison.

13. The apparatus of claim 12, wherein the digital value of the supply voltage and the digital input signal are processed to predict if a condition causing clipping of the audio signal is present.

14. The apparatus of claim 12, wherein the gain is set to a predetermined value when the supply voltage is at a nominal value and the gain is to be reduced when the supply voltage decreases from the nominal value.

15. The apparatus of claim 12, wherein the gain is set to a predetermined value when the supply voltage is at the nominal value and the gain is to be reduced when the supply voltage decreases to a lower voltage value from the nominal value and a signal level of the input signal approaches the lower voltage value.

16. The apparatus of claim 12, wherein the digital input signal is set to full scale at a nominal value of the supply voltage and the gain is to be reduced when the supply voltage decreases to a lower voltage value from the nominal value so that the digital input signal is compressed to reduce clipping of the audio signal.

17. The apparatus of claim 11, wherein said delta-sigma modulator stage includes a divider and multiplier coupled to the supply voltage to compensate for changes in the supply voltage by adjusting the gain in the delta-sigma modulator stage.

18. The apparatus of claim 16, wherein the gain is set to unity at the full scale at the nominal value of the supply voltage.

19. The apparatus of claim 15, wherein the gain control unit returns the gain to a predetermined value when the supply voltage returns to the nominal value.

20. The apparatus of claim 19, wherein a response time to reduce the gain is approximately 1 dB every one millisecond.

21. The apparatus of claim 20, wherein the response time to return the gain to the predetermined value is approximately 1 dB every 100 millisecond.

22. The apparatus of claim 10, wherein said gain control unit separates the monitoring of the digital input signal at different frequency bands and adjusts the gain across the different frequency bands.

23. A method, comprising:
monitoring a supply voltage of a power supply coupled to drive an audio output of a switching amplifier;
monitoring a digital input signal and the supply voltage; and
adjusting a gain of the digital input signal when comparing a value of the supply voltage to a value of the input signal to reduce distortion of the audio output when a condition for distortion is noted.

24. The method of claim 23 further comprising predicting the condition for distortion.

25. The method of claim 23, wherein the digital input signal is set to full scale at a nominal value of the supply voltage and the gain is to be reduced when the voltage value decreases to a lower voltage value from a nominal value so that the digital input signal is compressed to reduce clipping of the audio output.

26. The method of claim 23, further comprising compensating for a change in the supply voltage by adjusting the gain of a delta-sigma modulator used to filter and quantize the digital input signal.

27. The method of claim 23, further comprising filtering the digital input signal into different frequency bands and adjusting the gain separately across the different frequency bands.

* * * * *